(12) United States Patent
Liaw et al.

(10) Patent No.: US 6,180,530 B1
(45) Date of Patent: Jan. 30, 2001

(54) SELF-ALIGNED CONTACT STRUCTURE

(75) Inventors: Jhon-Jhy Liaw, Taipei; Jin-Yuan Lee, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/053,218

(22) Filed: Apr. 1, 1998

(51) Int. Cl.[7] ................................................. H01L 21/3065
(52) U.S. Cl. ........................ 438/706; 438/710; 438/712; 438/714
(58) Field of Search ..................................... 438/735, 737, 438/754, 742, 751, 739, 753, 663, 668, 706, 710, 712

(56) References Cited

U.S. PATENT DOCUMENTS

| 5,460,995 | 10/1995 | Kiyono et al. | 437/52 |
|---|---|---|---|
| 5,484,741 | 1/1996 | Bergemont | 437/43 |
| 5,677,557 | 10/1997 | Wuu et al. | 257/382 |
| 5,795,827 | * 8/1998 | Liaw et al. | 438/663 |
| 5,814,886 | * 9/1998 | Mano | 257/734 |
| 5,817,562 | * 10/1998 | Chang et al. | 438/305 |
| 5,874,359 | * 4/1999 | Liaw et al. | 438/640 |
| 5,904,521 | * 5/1999 | Jeng et al. | 438/253 |

* cited by examiner

Primary Examiner—Benjamin L. Utech
Assistant Examiner—Lan Vinh
(74) Attorney, Agent, or Firm—George O. Saile; Stephen B. Ackerman

(57) ABSTRACT

A method for forming a SAC structure, for a SRAM device, has been developed. The SAC structure is comprised of a narrow portion, located in a narrow region of the SAC opening, contacting an active device region, in narrow spaces between polysilicon gate structures. The SAC structure is also comprised of a wide portion, located in a wide region of the SAC opening, overlying a non-active device region. A metal contact structure, connects an overlying metal interconnect structure, to the wide portion of the underlying SAC structure. The SAC structure is comprised of a tungsten plug, enveloped by a titanium nitride-titanium layer.

19 Claims, 7 Drawing Sheets

SELF-ALIGNED CONTACT STRUCTURE

BACKGROUND OF THE INVENTION

(1) Field of the Invention

The present invention relates to processes used to fabricate semiconductor devices, and more specifically to a process used to create an extended, self-aligned contact region, for a static random access memory, (SRAM), device.

(2) Description of Prior Art

Static random access memory, (SRAM), cells are usually designed to include six, metal oxide semiconductor field effect transistors, (MOSFET), usually four N channel, and two P channel, MOSFETs. The SRAM performance and cost objectives have been successfully addressed by the ability of the semiconductor industry to fabricate SRAM devices, using sub-micron features. The smaller features result in a decrease in performance degrading capacitances and resistances, while also allowing a greater number of smaller SRAM chips, to be obtained from a specific size starting substrate, thus reducing the manufacturing cost of a specific SRAM chip. In addition the processes and structures, needed to create metal contacts to source and drain regions, have been optimized via use of a self-aligned contact, (SAC), structure, contacting underlying source and drain regions located in the semiconductor substrate, between gate structures. The use of SAC structures, have also resulted in additional miniaturization of SRAM devices, allowing performance and cost objectives to be further enhanced.

The use of SAC structures, for contact to source and drain regions of SRAM devices, has however made it difficult to reduce the pitch between the source and drain regions, and the adjacent gate structures. The shrinking space between gate structures, has resulted in the creation of narrow SAC structures, thus resulting in SAC structures with higher resistance than counterparts fabricated using wider SAC structures. This invention will describe a new SAC design in which the SAC opening is comprised of a narrow opening, between gate structures, allowing the desirable SRAM miniaturization to be achieved, but also comprised with a wider opening component, extended to overlay a non-active SRAM region. Thus a tungsten fill of the two shaped SAC opening creates a SAC structure that offers: a low resistance local interconnect level; a narrow spacing between gate structures; and a wide landing area for an overlying metal contact structure.

Prior art, such as Kiyono, et al, in U.S. Pat. No. 5,460,995, show a contact structure, for an SRAM device, however the SAC design and process, used for this invention, were not similar to this invention.

SUMMARY OF THE INVENTION

It is an object of this invention to create a SAC structure for a SRAM cell.

It is another object of this invention to use a SAC opening, comprised of a narrow portion, exposing source and drain regions, in the narrow spaces between gate structures, and comprised of a wider portion, overlying non-active regions of the SRAM device.

It is still another object of this invention to fill the SAC opening with tungsten, creating a SAC structure that contacts source and drain regions, in the narrow spaces between gate structure, and allows contact to an overlying metal, in the wider portions of the SAC structure.

In accordance with the present invention a method for creating a SAC structure, used as a local interconnect layer, and used for contact to underlying source and drain regions, located in the narrow spaces between gate structures, and for contact to an overlying metal structure, has been developed. A two shaped, SAC opening, is formed in a first insulator layer, comprised of a narrow SAC opening shape, exposing source and drain regions, between gate structures, and comprised of a wider SAC opening, connected to the narrow SAC opening, overlying a non-active region of a SRAM device. A first tungsten plug is formed in the two shaped, SAC opening, resulting in a SAC structure, comprised of a narrow shape, contacting source and drain regions, in the narrow spaces between gate structures, and a wider shape, overlying a non-active region of the SRAM device. After deposition of a second insulator layer, a contact hole is opened in the second insulator layer, exposing the top surface of the wider shape of the SAC structure. A second tungsten plug is formed in the contact hole, followed by the creation of an metal interconnect structure, overlying, and contacting the second tungsten plug.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for creating a SAC structure, for a SRAM device, used as a local interconnect layer, and used for contact to source and drain regions, in the narrow spaces between gate structures, and for contact from an overlying metal structure, will now be described in detail. The SAC structure, described in this invention, will be used in SRAM designs, comprised of complimentary MOSFET devices, (N channel as well as P channel devices). However the SAC structure, of this invention, can be used for designs other than SRAM. In addition, although this invention describes the SAC structure, applied to N channel MOSFET devices, it can also be applied to P channel devices.

Figure 1A:
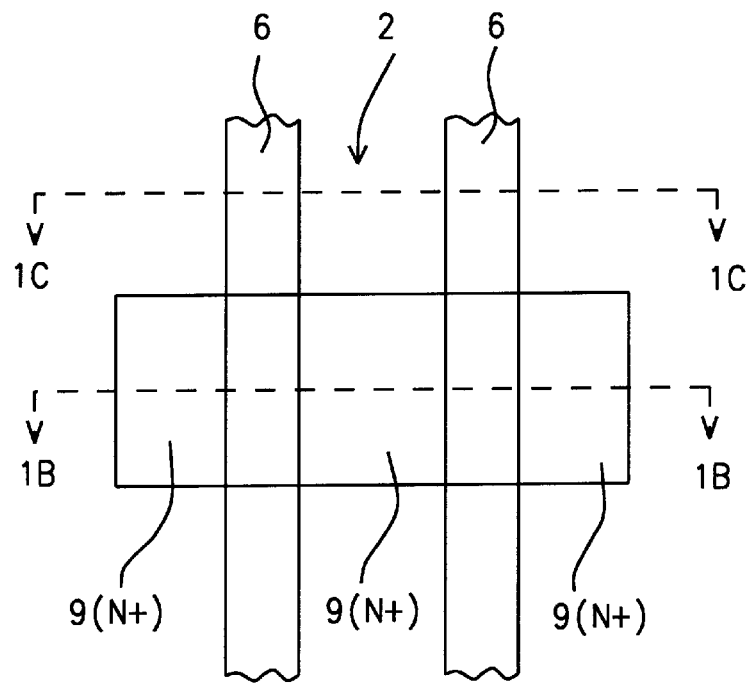
FIGS. 1A, 3A, 5A, 6A, which schematically show the top view of the SAC structure, at key stages of fabrication.
Figure 1B:
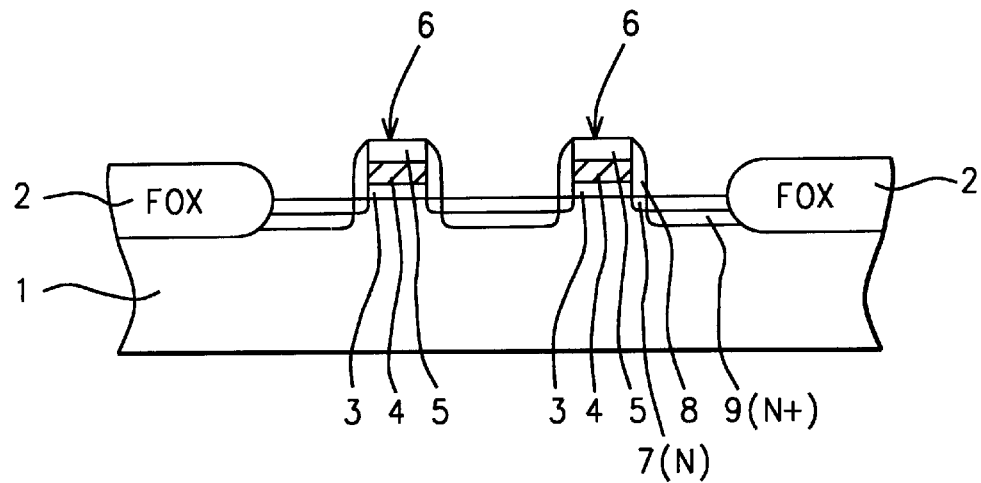
FIGS. 1B, 1C, 2, 3B, 3C, 4, 5B, 6B, 6C, which schematically, in cross-sectional style, show key stages of fabrication used to create the SAC structure, used for a SRAM cell device.
Figure 1C:
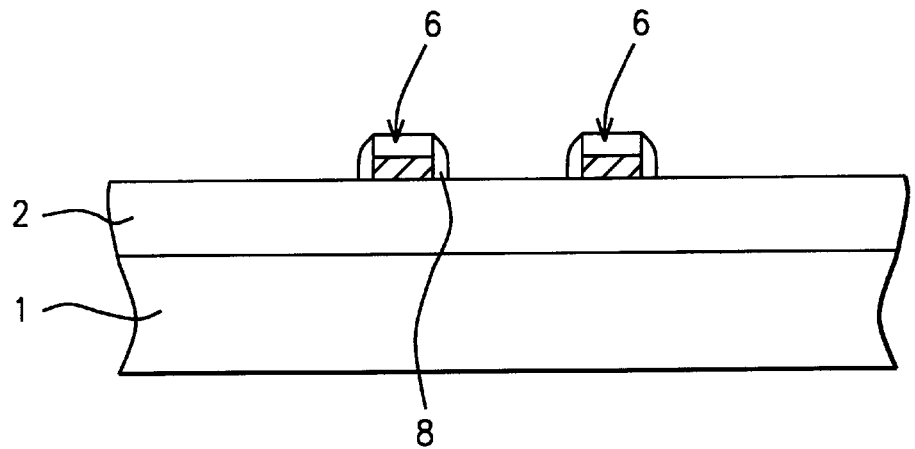

FIG. 1A, schematically shows a top view of SAC structure, while FIG. 1B, and FIG. 1c, schematically show cross-sectional views of the SAC structure, described in this invention. Referring to FIG. 1B, a cross-sectional view, where polysilicon gate structures will overlay active device regions, a P type, single crystalline, silicon substrate 1, with a <100> crystallographic orientation, is shown. Field oxide, (FOX), regions 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride-silicon oxide composite masking layer. After removal of the composite, oxidation resistant mask, a thin gate, silicon dioxide layer 3, is thermally grown, in an oxygen steam ambient, at a temperature between about 800 to 1000° C., to a thickness between about 35 to 150 Angstroms. Next a layer of polysilicon 4, is deposited using low pressure chemical vapor deposition, (LPCVD), procedures, at a temperature between about 500 to 700° C., to a thickness between about 500 to 2000 Angstroms.

Polysilicon layer 4, can be in situ doped during, via the addition of phosphine, or arsine, to a silane ambient, or polysilicon layer 4, can be deposited intrinsically and doped via an ion implantation procedure, using arsenic or phosphorous ions. Polysilicon layer 4, can be replaced, if lower word line resistance are desired, by a polycide layer, comprised of a metal silicide on a polysilicon layer. A first silicon oxide layer 5, is next deposited using either LPCVD or plasma enhanced chemical vapor deposition, (PECVD), procedures, at a temperature between about 350 to 750° C., to a thickness between about 1000 to 3000 Angstroms, using tetraethylorthosilicate, (TEOS), as a source.

Still referring to FIG. 1B, conventional photolithographic and reactive ion etching, (RIE), procedures, using $CHF_3$ as an etchant for first silicon oxide layer 5, and $Cl_2$ as an etchant for polysilicon layer 4, are used to create silicon oxide capped, polysilicon gate structure 6, schematically shown schematically in FIG. 1B. After photoresist removal via plasma oxygen ashing and careful wet cleans, a lightly doped source and drain region 7, is created via ion implantation of phosphorous or arsenic, at an energy between about 25 to 75 KeV, at a dose between about 5E11 to 5E13 atoms/$cm^2$. A second silicon oxide layer is deposited, again via use of either LPCVD or PECVD procedures, at a temperature between about 350 to 750° C., to a thickness between about 1500 to 4000 Angstroms, using TEOS as a source, followed, by an anisotropic RIE procedure, using $CHF_3$ as an etchant, to create insulator spacers 8. Insulator spacers 8, can also be comprised of silicon nitride. Heavily doped source and drain regions 9, are then produced via ion implantation of either arsenic or phosphorous, at an energy between about 30 to 100 KeV, at a dose between about 1E14 to 1E16 atoms/$cm^2$. This region is also shown schematically in FIG. 1B.

FIG. 1A, a top view of the SAC structure, at this stage of fabrication, shows polysilicon gate structures 6, traversing an active region of the subsequent SRAM device, with heavily doped source and drain regions 9, located in the active device regions, in an area in which the active device region is not covered by polysilicon gate structures 6. FOX region 2, is also shown. FIG. 1C, schematically shows a cross-section of a region in which polysilicon gate structures 6, overlays FOX region 2.

Figure 2:
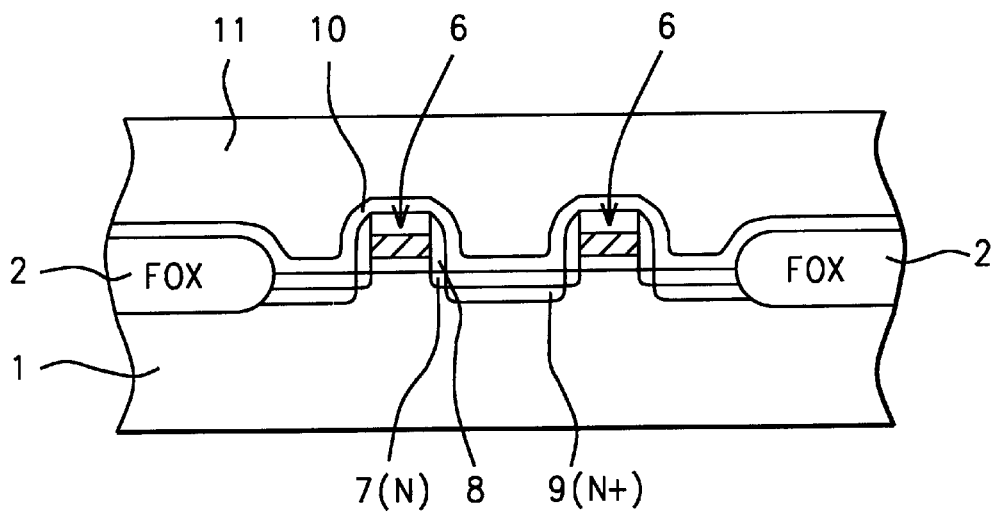

A silicon nitride layer 10, is next deposited using LPCVD or PECVD procedures, to a thickness between about 300 to 600 Angstroms, followed by the deposition of first insulator layer 11. First insulator layer 11, is a composite insulator layer, comprised of an underlying layer of silicon oxide, deposited using PECVD procedures, using TEOS as a source, to a thickness between about 1000 to 2000 Angstroms, and is also comprised of an overlying layer of BPSG, (boro-phosphosilicate glass), again deposited using PECVD procedures, to a thickness between about 3000 to 12000 Angstroms, using TEOS as a source, and with the addition of phosphine and diborane to the ambient, needed to create the overlying BPSG insulator layer. A reflow procedure, performed at a temperature between about 750 to 900° C., is employed to create a smooth top surface topology. The result of these procedures is schematically shown in FIG. 2.

Figure 3A:
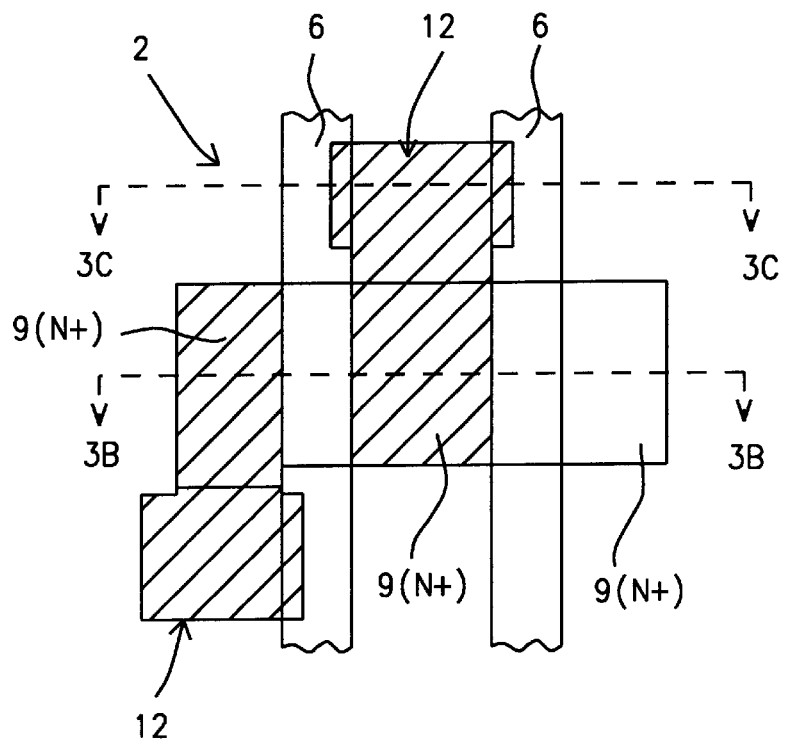
Figure 3B:
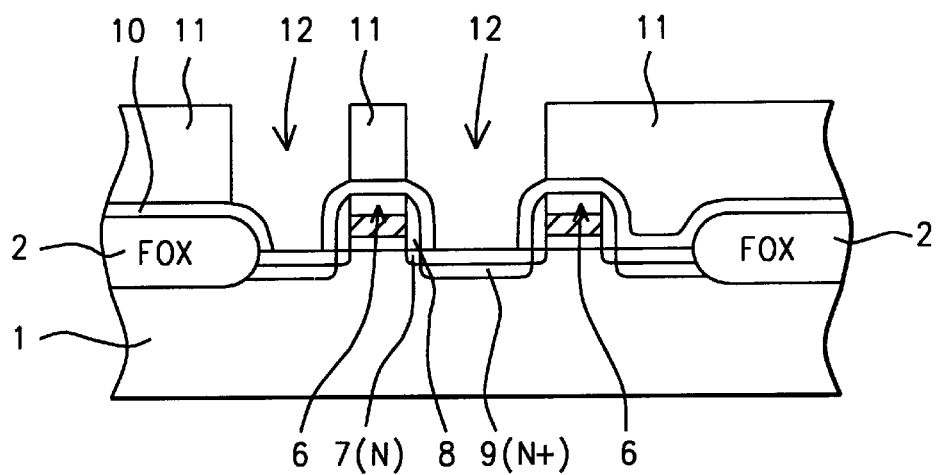
Figure 3C:
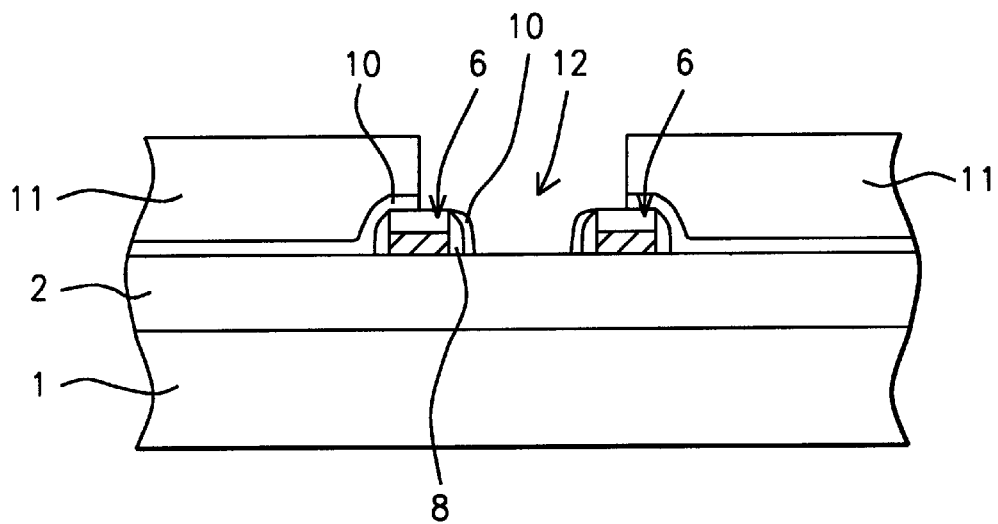

SAC openings 12, are next formed, with the top view displayed schematically in FIG. 3A. SAC openings 12, are comprised of narrow portion, exposing heavily doped source and drain regions 9, between polysilicon gate structures 6, and comprised of a wider portion, overlying FOX region 2. FIG. 3B, and FIG. 3B, schematically show the cross-sectional views of the SAC structure, at this stage of processing. Referring to FIG. 3B, photolithographic and RIE procedures, using $CHF_3$ as an etchant, are used to create the narrow portion of SAC opening 12, in first insulator layer 11, with the anisotropic RIE procedure, stopping on the underlying silicon nitride layer 10. A subsequent anisotropic RIE procedure, using $SF_6$ of $CF_4$ as an etchant, is next used to remove regions of silicon nitride layer 11, exposed at the bottom of SAC opening 12, exposing heavily doped source and drain regions 9. FIG. 3C, shows the result of opening of the wider portion of SAC opening 12, exposing a wide portion of underlying FOX region 2. Removal of the photoresist shapes, used as a mask during the patterning of SAC openings 12, is accomplished via plasma oxygen ashing and careful wet cleans.

Figure 4:
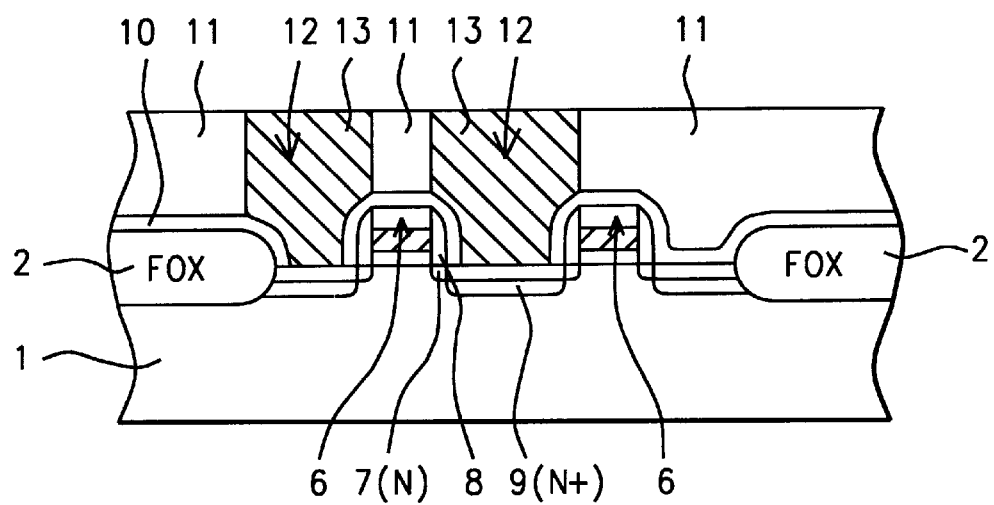

FIG. 4, schematically, in cross-sectional style, shows the formation of SAC structure 13, in SAC opening 12. A layer of titanium, followed by a layer of titanium nitride, is deposited on the exposed sides of SAC opening 12, and on the top surface of first insulator layer 11. The underlying titanium layer is deposited using R.F. sputtering, to a thickness between about 200 to 400 Angstroms, and is used to improve contact between a subsequent overlying first tungsten plug, and the underlying heavily doped source and drain region 9, and is also used to improve adhesion of a subsequent first tungsten plug, to underlying first insulator layer 11. The overlying layer of titanium nitride layer, is also deposited using R.F. sputtering, to a thickness between about 600 to 1500 Angstroms, and is used as a barrier layer to protect underlying materials from the reactants, and reaction products, of a subsequent tungsten deposition. Finally a tungsten layer is deposited, using LPCVD procedures, to a thickness between about 3000 to 7000 Angstroms, at a temperature between about 400 to 600° C., completely filling SAC opening 12. An anisotropic RIE procedure, using $Cl_2$ as an etchant, is used to remove tungsten, titanium nitride, and titanium, from the top surface of first insulator layer 11, resulting in SAC structure 13, comprised of a first tungsten plug in SAC opening 12, and a titanium nitride-titanium layer on the sides of SAC opening 12. A chemical mechanical polishing, (CMP), procedure, can also be used to remove unwanted materials from the top surface of first insulator layer 11, resulting in SAC structure 13, in SAC opening 12. A narrow portion of SAC structure 13, now contacts heavily doped source and drain region 9, while the wider portion of SAC structure 13, resides on FOX region 2.

Figure 5A:
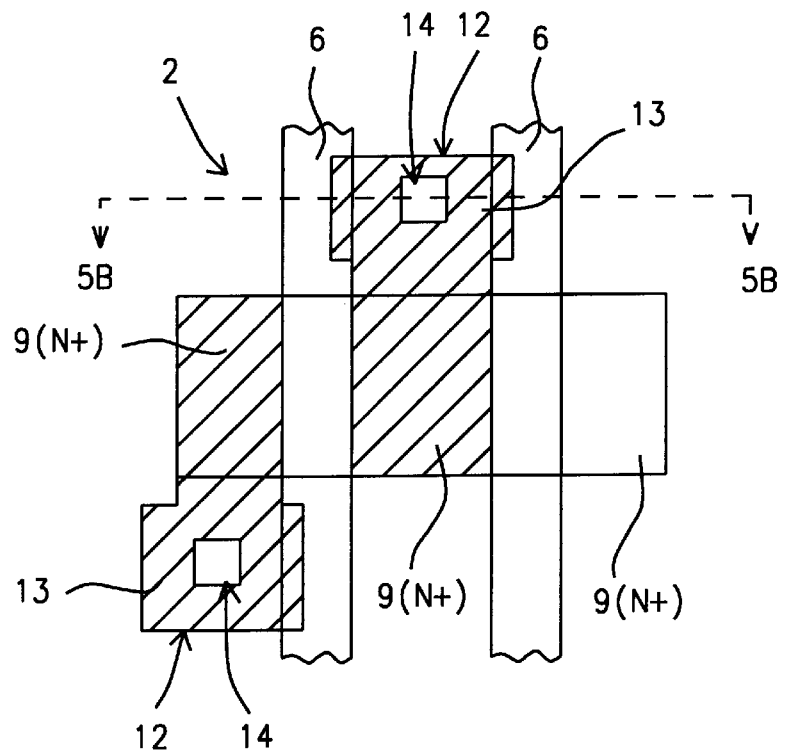
Figure 5B:
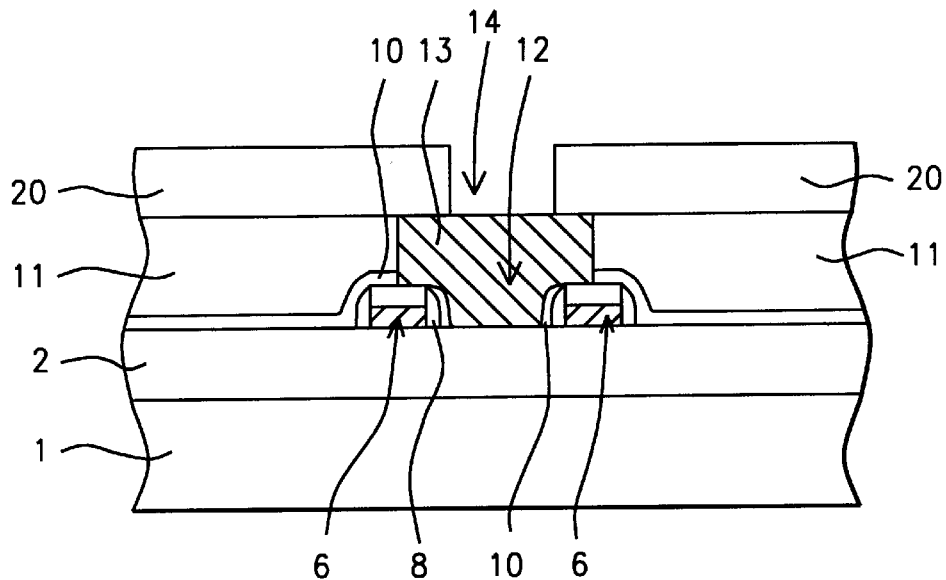

A contact hole 14, shown schematically for a top view, in FIG. 5A, and for a cross-sectional view, in FIG. 5B, is next formed. Referring to FIG. 5B, a second insulator layer 20, comprised PECVD silicon oxide, is deposited to a thickness between about 3000 to 6000 Angstroms, using TEOS as a source. Second insulator layer 20, can also be comprised of an underlying silicon oxide layer, and an overlying BPSG layer. Photolithographic and anisotropic RIE procedures, using $CHF_3$ as an etchant, are used to form contact hole 14, exposing the top surface, of the wide portion, of SAC structures 13, in a region in which SAC structures 13, overlay FOX region 2. This can also be seen in the top view presented in FIG. 5A.

Figure 6A:
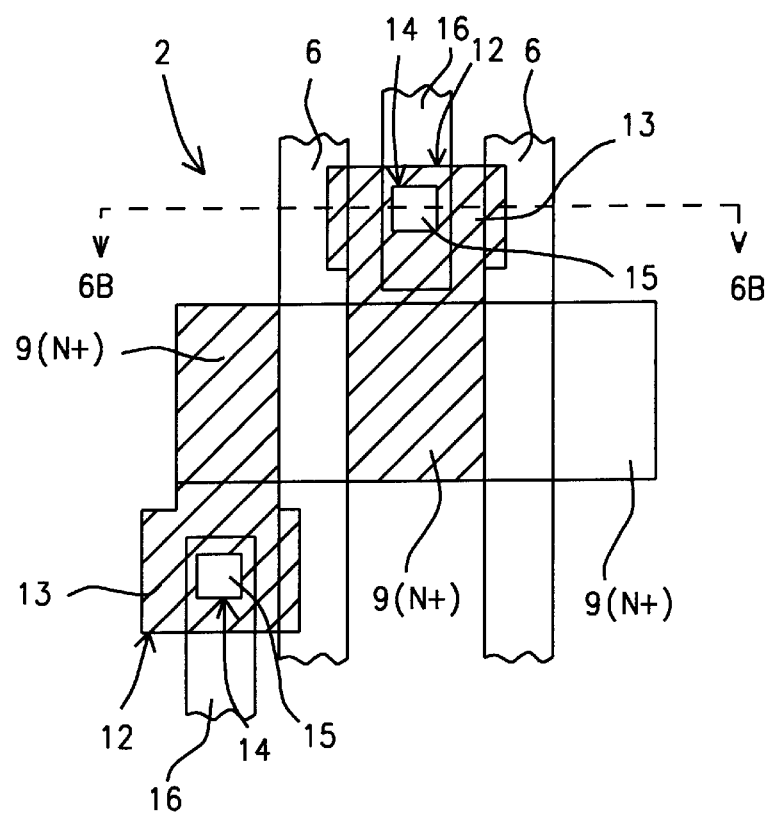
Figure 6B:
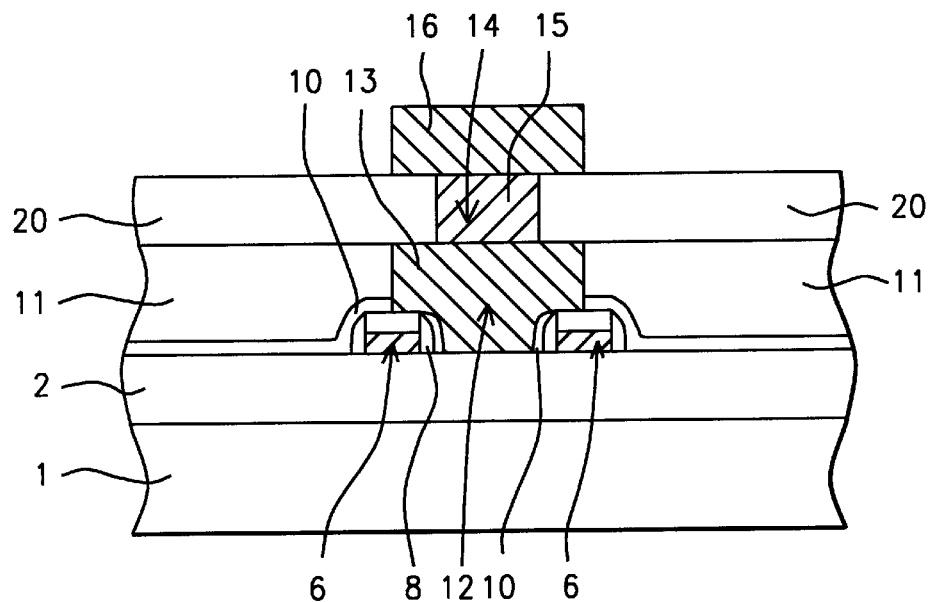
Figure 6C:
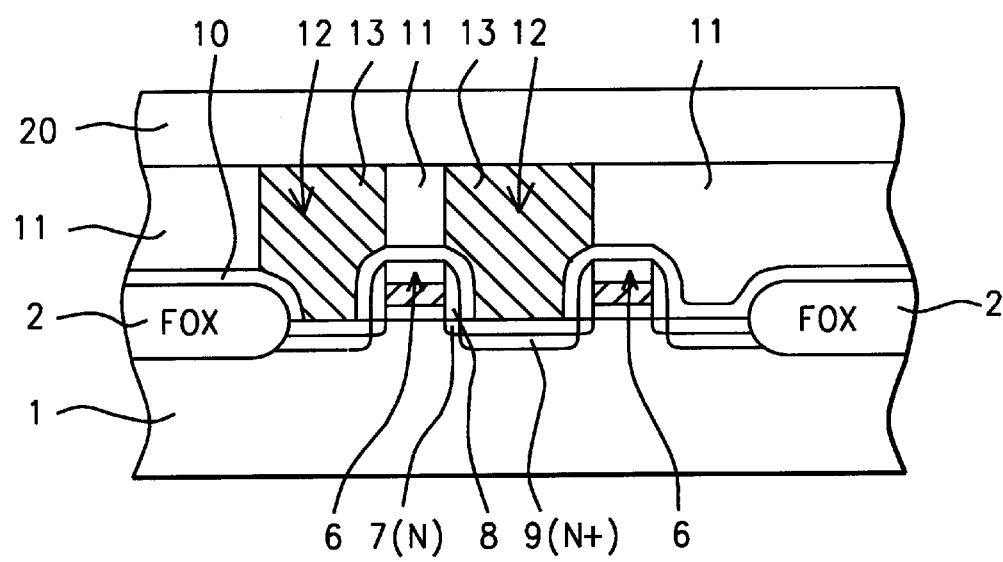

A second tungsten plug 15, lined with a titanium nitride barrier layer, is next formed and schematically shown in cross-sectional form in FIG. 6B, and for with the top view, in FIG. 6A. First a titanium nitride layer is deposited using R.F. sputtering, to a thickness between about 200 to 1500 Angstroms, not completely filling contact hole 14. A tungsten layer is then deposited via LPCVD procedures, to a thickness between about 3000 to 8000 Angstroms, which does completely fill contact hole 14. An anisotropic RIE procedure, using $Cl_2$ as an etchant, is used to remove tungsten and titanium nitride layers from the top surface of second insulator layer 20, creating second tungsten plug 15, in titanium nitride lined, contact hole 14. Creation of second tungsten plug 15, in contact hole 14, can also be accomplished using a CMP procedure. This is schematically shown in FIG. 6B. An interconnect metal layer, comprised of aluminum, with between about 0 to 2 weight % copper, is next deposited, via R.F. sputtering, to a thickness between about 2000 to 6000 Angstroms. Photolithographic and anisotropic RIE procedures, using $Cl_2$ as an etchant, are used to form metal interconnect structure 16, overlying and contacting, second tungsten plug 15, which in turn contacts the top surface of the underlying, wide portion of SAC structure 12. This can also be seen in the schematic top view offered in FIG. 6A. A cross-sectional view in FIG. 6C, created through a region in which the narrow portion of SAC structure 12, contacts the heavily doped source and drain region 9, located between the narrow spaces between polysilicon gate structures 6, is included to highlight the absence of metal interconnect structure 16, and of second tungsten plug 15, overlying the narrow portion of SAC opening 12. Removal of the photoresist layer, used as a mask for definition of metal interconnect structure 16, is once again performed via plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a SAC structure, for a SRAM device, on a semiconductor substrate, comprising the steps of:
   providing a field oxide region in said semiconductor substrate;
   providing transfer gate transistors, comprised of polysilicon gate structures, on a thin gate insulator layer, and comprised of source and drain regions, in said semiconductor substrate, between said polysilicon gate structures;
   forming a dual shape SAC opening, in a first insulator layer, with said dual shape SAC opening comprised with a first portion featuring a narrow opening, exposing a portion of said source and drain regions located between said polysilicon gate structure, and with said dual shape SAC opening comprised with a second portion featuring a wide opening exposing a portion of said field oxide region;
   forming a SAC structure in said dual shape SAC opening;
   depositing a second insulator layer;
   opening a contact hole in said second insulator layer, exposing the top surface of said SAC structure, in a region in which said SAC structure resides in said second portion of said dual shape SAC opening;
   forming a metal contact structure, in said contact hole, wherein said metal contact structure, is comprised of a second tungsten plug, on a titanium nitride layer, with said second tungsten plug from a deposition of a tungsten layer, via LPCVD procedures and from a following anisotropic RIE procedure, using $Cl_2$ as an etchant;
   forming a metal interconnect structure, overlying and contacting said metal contact structure.

2. The method of claim 1, wherein said first insulator layer is a composite insulator layer, comprised of: an underlying silicon oxide layer, deposited via LPCVD procedures, to a thickness between about 1000 to 2000 Angstroms, using TEOS as a source; and comprised of an overlying borophosphosilicate layer, deposited using PECVD procedures, to a thickness between about 3000 to 12000 Angstroms, using TEOS as a source, with the addition of phosphine and diborane dopants.

3. The method of claim 1, wherein said SAC opening, in said first insulator layer, comprised of said narrow opening of said SAC opening, exposing said source and drain regions, and comprised of said wide opening of said SAC opening, exposing the top surface of underlying, said field oxide region, is created via an anisotropic RIE procedure, using $CHF_3$ as an etchant.

4. The method of claim 1, wherein said SAC structure, in said SAC opening, is comprised of a first tungsten plug, overlying a composite metal layer comprised of a titanium nitride layer, on a titanium layer, with said tungsten plug formed from a tungsten layer, obtained via LPCVD procedures, to a thickness between about 3000 to 6000 Angstroms, and with said composite metal layer formed from said titanium nitride layer, obtained via R.F. sputtering, to a thickness between about 600 to 1500 Angstroms, and from said titanium layer, obtained via R.F. sputtering, at a thickness between about 200 to 400 Angstroms.

5. The method of claim 1, wherein said SAC structure, in said SAC opening, is formed via an anisotropic RIE procedure, using $Cl_2$ as an etchant for the tungsten layer, for the titanium nitride layer, and for the titanium layer.

6. A method for forming a SAC structure, for a SRAM device, on a semiconductor substrate, with said SAC structure located in a SAC opening, comprised of a narrow opening, overlying an active device region, and comprised of a wide opening, overlying a non-active device region, comprising the steps of:
   providing a field oxide region in said semiconductor substrate;
   providing underlying SRAM transfer gate transistors, comprised of polysilicon gate structures on a gate insulator layer, and with source and drain regions, in said semiconductor substrate, between said polysilicon gate structures;
   depositing a silicon nitride layer;
   depositing a first insulator layer;
   reflowing of said first insulator layer;
   creating said SAC opening, in said first insulator layer, and in said silicon nitride layer, with said narrow opening, of said SAC opening, exposing said source and drain regions, between said polysilicon gate structures, and with said wide opening, of SAC opening, exposing the top surface of said field oxide region;
   depositing a titanium layer, on the top surface of said first insulator layer, and in said SAC opening;
   depositing a first titanium nitride layer;
   depositing a first tungsten layer, completely filling said SAC opening;
   removing regions of said tungsten layer, of said first titanium nitride layer, and of said titanium layer, from the top surface of said first insulator layer, creating said SAC structure, in said SAC opening, comprised of a first tungsten plug, enveloped by said first titanium nitride layer, and said titanium layer;
   depositing a second insulator layer;
   opening a contact hole in said second insulator layer, exposing the top surface of said SAC structure, in a region in which said SAC structure is located in said wide opening of said SAC opening;

depositing a second titanium nitride layer;

depositing a second tungsten layer;

removing regions of said second tungsten layer, and of said second titanium nitride layer, creating a second tungsten plug, enveloped by said second titanium nitride layer, in said contact hole;

depositing an aluminum based metal layer; and patterning of aluminum based layer, to form a metal interconnect structure, contacting underlying said second tungsten plug.

7. The method of claim 6, wherein said silicon nitride layer is deposited using LPCVD or PECVD procedures, to a thickness between about 200 to 700 Angstroms.

8. The method of claim 6, wherein said first insulator layer is comprised of an underlying silicon oxide layer, deposited using PECVD procedures, to a thickness between about 1000 to 2000 Angstroms, using TEOS as a source, and comprised of an overlying boro-phosphosilicate layer, deposited using PECVD procedures, to a thickness between about 3000 to 12000 Angstroms, using TEOS as a source with the addition of phosphine and diborane dopants.

9. The method of claim 6, wherein reflowing of said first insulator layer is performed at a temperature between about 750 to 900° C.

10. The method of claim 6, wherein said SAC opening, in said first insulator layer, and in said silicon nitride layer, is formed via an anisotropic RIE procedure, using $CHF_3$ as an etchant for said first insulator layer, and using $SF_6$ as an etchant for said silicon nitride layer.

11. The method of claim 6, wherein said titanium layer is deposited using R.F. sputtering, to a thickness between about 200 to 400 Angstroms.

12. The method of claim 6, wherein said first titanium nitride layer is deposited using R.F. sputtering to a thickness between about 600 to 1500 Angstroms.

13. The method of claim 6, wherein said tungsten layer is deposited using LPCVD procedures, at a temperature between about 400 to 600° C., to a thickness between about 3000 to 7000 Angstroms.

14. The method of claim 6, wherein said SAC structure is formed in said SAC opening, via an anisotropic RIE procedure, using $Cl_2$ as an etchant, removing said first tungsten layer, removing said first titanium nitride layer, and removing said titanium layer, from the top surface of said first insulator layer.

15. The method of claim 6, wherein said second insulator layer is silicon oxide, deposited using PECVD procedures, to a thickness between about 3000 to 6000 Angstroms.

16. The method of claim 6, wherein said second titanium nitride layer is deposited using R.F. sputtering, to a thickness between about 200 to 1500 Angstroms.

17. The method of claim 6, wherein said second tungsten layer is deposited using LPCVD procedures, to a thickness between about 3000 to 8000 Angstroms.

18. The method of claim 6, wherein said second tungsten plug is formed via an anisotropic RIE procedure, applied to said second tungsten layer, using $Cl_2$ as an etchant.

19. The method of claim 6, wherein said metal interconnect structure, is comprised of an aluminum based layer, obtained via R.F. sputtering, to a thickness between about 2000 to 6000 Angstroms, containing about 0 to 2 weight % copper.

* * * * *